(12) United States Patent
Schumann et al.

(10) Patent No.: US 7,684,245 B2
(45) Date of Patent: Mar. 23, 2010

(54) NON-VOLATILE MEMORY ARRAY ARCHITECTURE WITH JOINED WORD LINES

(75) Inventors: Steve Schumann, Sunnyvale, CA (US);
Massimiliano Frulio, Milan (IT);
Simone Bartoli, Cambiago (IT);
Lorenzo Bedarida, Vimercate (IT);
Edward Shue-Ching Hui, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 308 days.

(21) Appl. No.: 11/928,086

(22) Filed: Oct. 30, 2007

(65) Prior Publication Data

US 2009/0109754 A1 Apr. 30, 2009

(51) Int. Cl.
*G11C 11/34* (2006.01)
*G11C 16/04* (2006.01)
*G11C 5/06* (2006.01)

(52) U.S. Cl. .............................. 365/185.17; 365/185.05; 365/63

(58) Field of Classification Search ............ 365/185.05, 365/185.17, 63
See application file for complete search history.

(56) References Cited

U.S. PATENT DOCUMENTS

| | | | |
|---|---|---|---|
| 5,274,278 A | 12/1993 | Bauer et al. |
| 5,394,375 A | 2/1995 | Iwashita |
| 5,572,054 A | 11/1996 | Wang et al. |
| 5,768,174 A | 6/1998 | Seo et al. |
| 5,831,315 A | 11/1998 | Kengeri et al. |
| 5,841,688 A | 11/1998 | Shunichi et al. |
| 5,862,073 A | 1/1999 | Yeh et al. |
| 6,266,264 B1 | 7/2001 | Proebsting |
| 6,773,974 B2 | 8/2004 | Wang et al. |
| 6,879,505 B2 | 4/2005 | Scheuerlein |
| 6,909,131 B2 | 6/2005 | Liu et al. |
| 7,061,801 B1 | 6/2006 | Wong |
| 7,075,146 B2 | 7/2006 | Forbes |

*Primary Examiner*—Ly D Pham
(74) *Attorney, Agent, or Firm*—Schwegman, Lundberg & Woessner, P.A.

(57) ABSTRACT

In an embodiment, a non-volatile memory array wherein narrow word lines, as small as the minimum feature size width F, in separate strings, are extended outwardly from a non-volatile memory array and joined by wider connector segments. The joined word lines provide new opportunities. First, metal straps that can be formed to overlie the word lines can be joined by metal connector segments to the word lines. The connector segments can serve as an interface between the polysilicon word lines and the metal straps. Two adjacent word lines in the same string share a single metal strap using these segments thereby reducing the overall number of segments and contacts in the array. Increased width of the polysilicon joinder segments joining word lines in different strings, provides the opportunity for widening the connection beyond the minimum feature size so that contact may be readily made between the metal straps and the polysilicon word lines. Second, the joined word lines require fewer row decoder circuits. One row decoder is provided for each joined set of word lines.

25 Claims, 10 Drawing Sheets

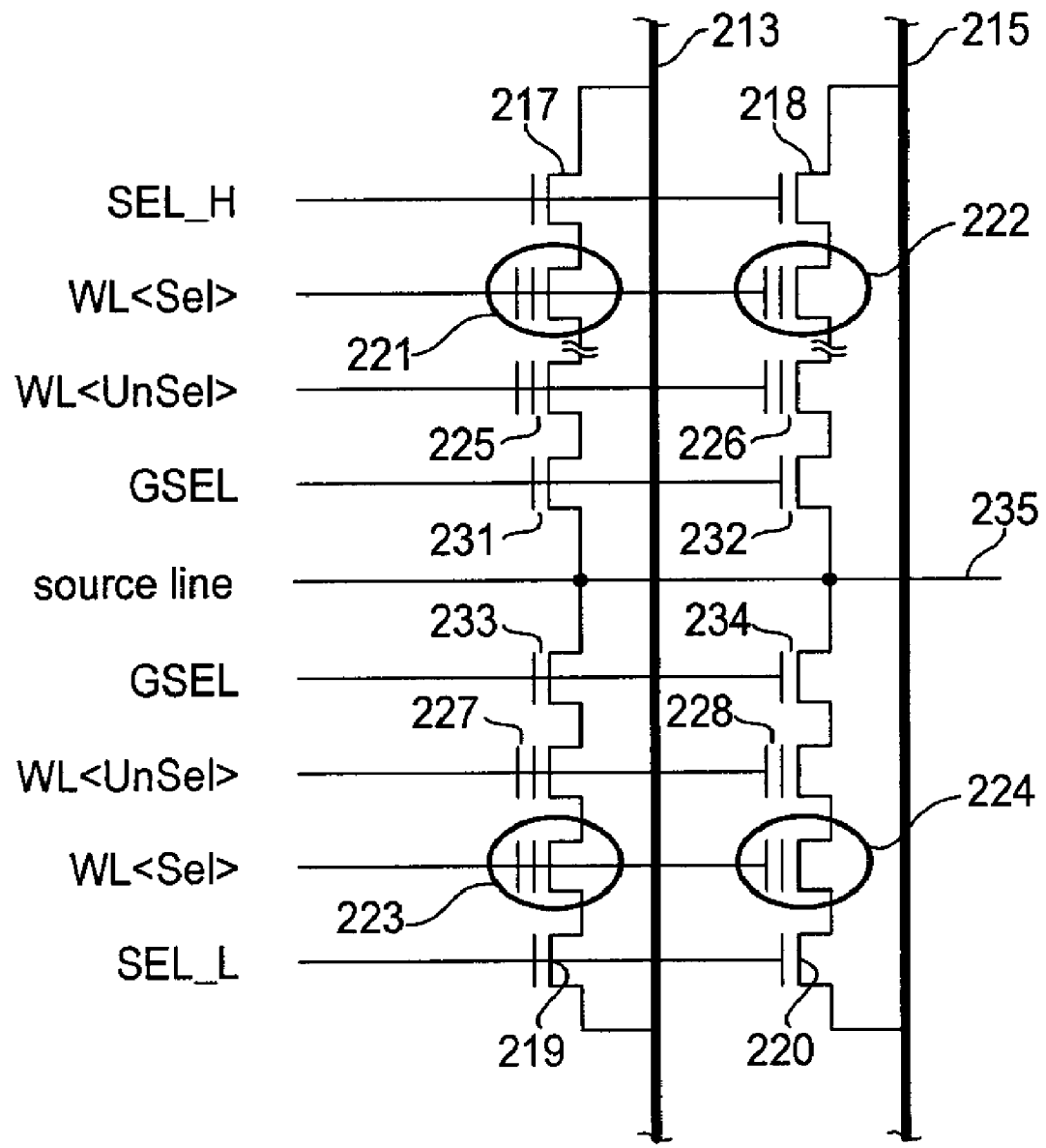
Fig. _ 9

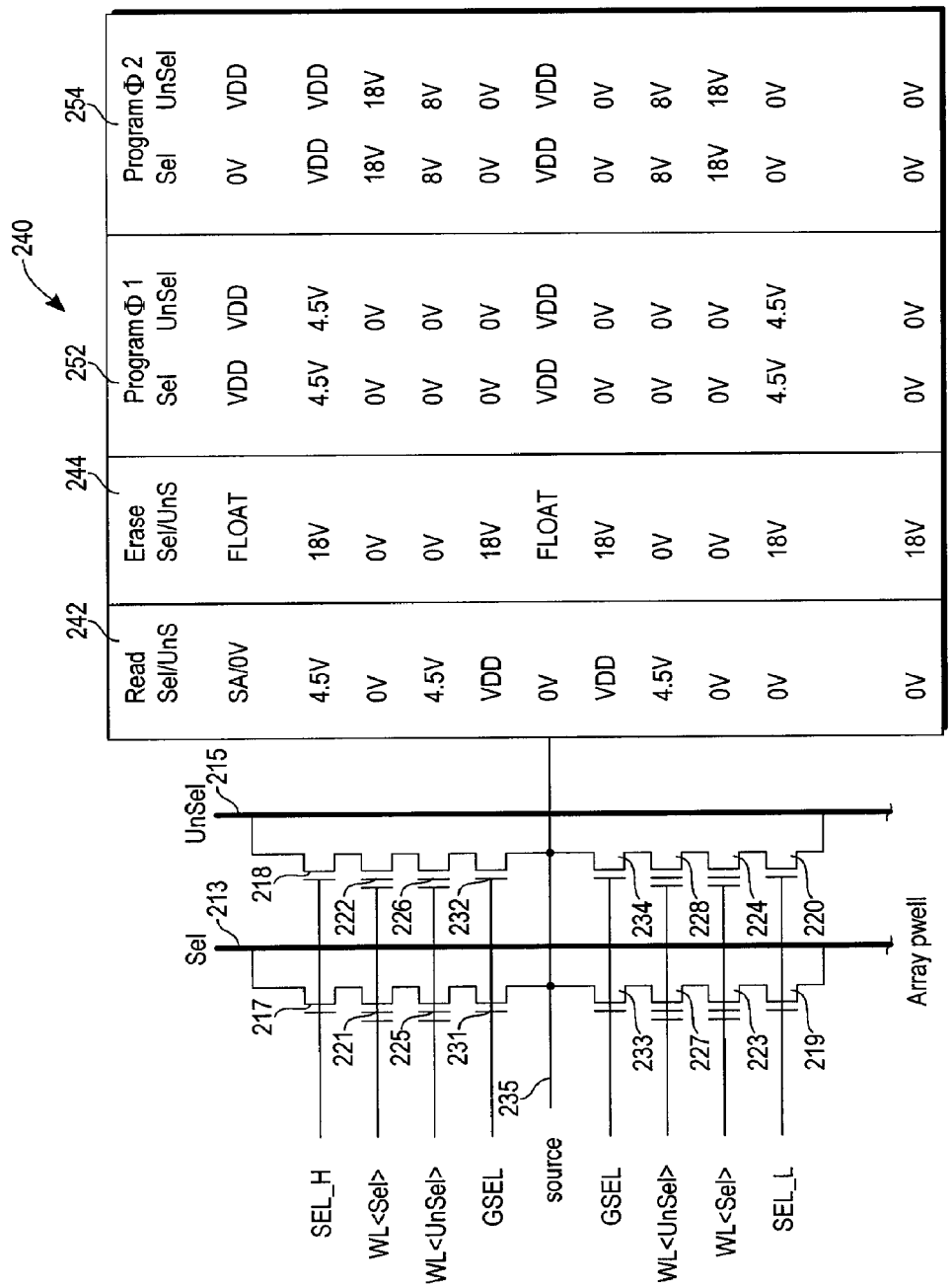
Fig._10

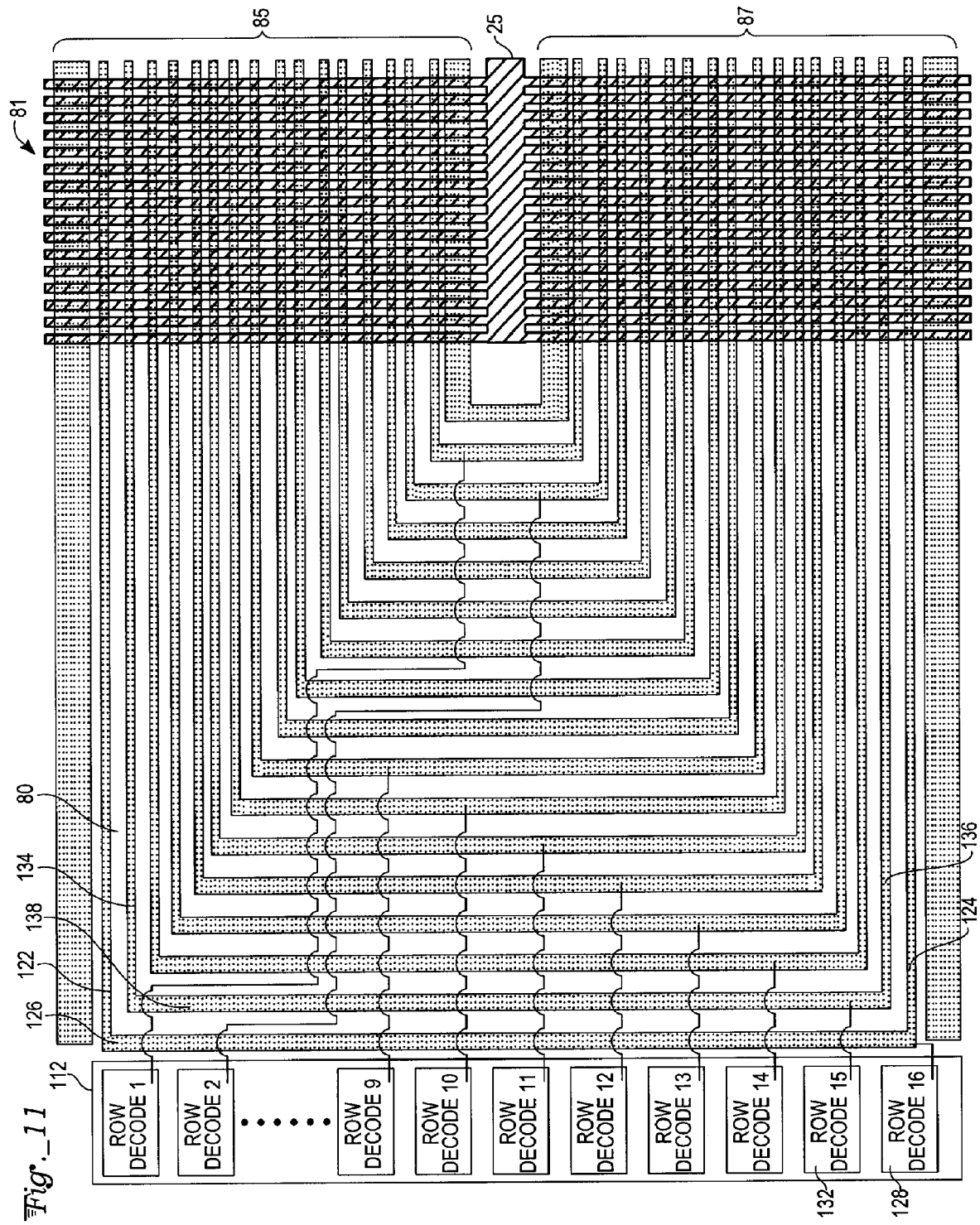

NON-VOLATILE MEMORY ARRAY ARCHITECTURE WITH JOINED WORD LINES

TECHNICAL FIELD

The invention relates to semiconductor memories and, in particular, to non-volatile memory arrays.

BACKGROUND ART

In semiconductor non-volatile memory arrays, word lines and bit lines are usually arranged in rows and columns, respectively, to address memory cells. Word lines and bit lines either span the entire array or large blocks of memory cells in the array. Address decoders formed of row decoders and column decoders select appropriate word lines and bit lines to program, read and erase memory cells. Bit lines are usually associated with subsurface source-drain electrodes, while word lines are usually associated with top level select gates of non-volatile memory transistors.

As non-volatile memory cell size shrinks, the smallest memory cells can have a dimension of F, the minimum feature size, or perhaps slightly larger such as 2F or 3F, when viewed in top view. As a specific dimension, F depends on lithographic equipment, but is scalable to whatever lithographic equipment is available. In modern stepper equipment, F is typically in the range of 40 to 150 nanometers and is forecast to become smaller. F depends on the wavelength of the exposing light multiplied by a resolution factor and divided by the numerical aperture of the lithographic system. The resolution factor depends on several variables in the photolithographic process including the quality of the photoresist used and the resolution enhancement techniques such as phase shift masks, off-axis illumination and optical proximity correction. In the industry, F is a characteristic of particular semiconductor manufacturing equipment that uses photolithography. For example, see U.S. Pat. No. 7,075,146 entitled A4F2 EEPROM NROM Memory Arrays with Vertical Devices by L. Forbes.

To make contact with the top level select gates of non-volatile transistors, word lines made of polysilicon are used since they can be fabricated using photolithography as lines having a width of dimension F to contact select gates in a row. Similarly, the distance between word lines can also have the dimension F. Contact is established at the outside periphery of the array or large block of the array whereby electrical signals are propagated on the word line across the array or block. The resistance of polysilicon word lines, as well as distributed capacitance, reduces access time to and from the array. In the prior art, the problem of slow memory array access time due to word line resistance has been recognized. One prior art solution is to use metal straps parallel to the polysilicon word line to lower word line resistance. For example, see U.S. Pat. No. 6,266,264 to R. Proebsting. However, it is not possible to make metal straps the same width as the ultra narrow word lines and so a problem exists in locating metal straps for small geometry memory arrays having narrow width word lines.

Another prior art approach is to stack word line straps in two metal layers with half of the polysilicon word line strapped in a first metal layer and the other half in the second metal layer. This approach has been used in several variations but does not appear suitable where word lines have the minimum feature size, F, as a width dimension.

SUMMARY OF INVENTION

An embodiment of the invention discloses a non-volatile memory array with word lines having cascaded NAND strings that allow for a new NAND organization. A new memory architecture is made by first joining the word lines of corresponding bits of two or more cascaded strings of a NAND arrangement, with each string having an independent select device. In an embodiment featuring higher word line speed, two narrow adjacent word lines in the same string are covered by one wider metal strap, with each of the word lines joined to link corresponding word lines in the other string. The word lines have transverse joinder segments in top view with the joinder segments being outside of the array or block. The joinder segments are wider than the word lines they connect. One way to create such an organization of word lines and joinder segments is with a series of nested loops. In one embodiment, the nested loops are U-shaped but could have other shapes. The number of metal straps is half the number of word lines. Since only one string is selected at a time, each strap is uniquely associated with one word line, thereby lowering resistance. One metal strap in one string covers two word lines in the same string but is only strapped to one word line. A corresponding strap in the other string, also covering two word lines, is joined to the other word line. Joinder occurs where the word lines exit the array or block where word lines are wider. At this location, word lines can be made wider, say 2F wide, or wider, without affecting dimensions of the array itself. The increased width is ideal for connecting word lines to metal straps by means of vertical vias or contacts. All contacts to poly word lines are made to a first metal layer of interconnects. All contacts to metal straps are made from the first metal layer of interconnects to a second metal layer of straps. The interconnects are relatively small islands of metal in mutually non-interfering relationship.

In another embodiment, pairs of joined word lines are associated with a single row decoder. With two word lines associated with a single row decoder, the number of row decoders is reduced.

DETAILED DESCRIPTION OF THE DRAWINGS

FIG. 9 is another simplified schematic detail of the plan view of FIG. 1 in accordance with an embodiment of the invention.

FIG. 10 is a voltage diagram for the simplified schematic detail of FIG. 9 in accordance with an embodiment of the invention.

FIG. 11 is an electrical schematic plan view of a second embodiment of a memory array in accordance with an embodiment of the invention.

BEST MODE OF CARRYING OUT THE INVENTION

Figure 1:
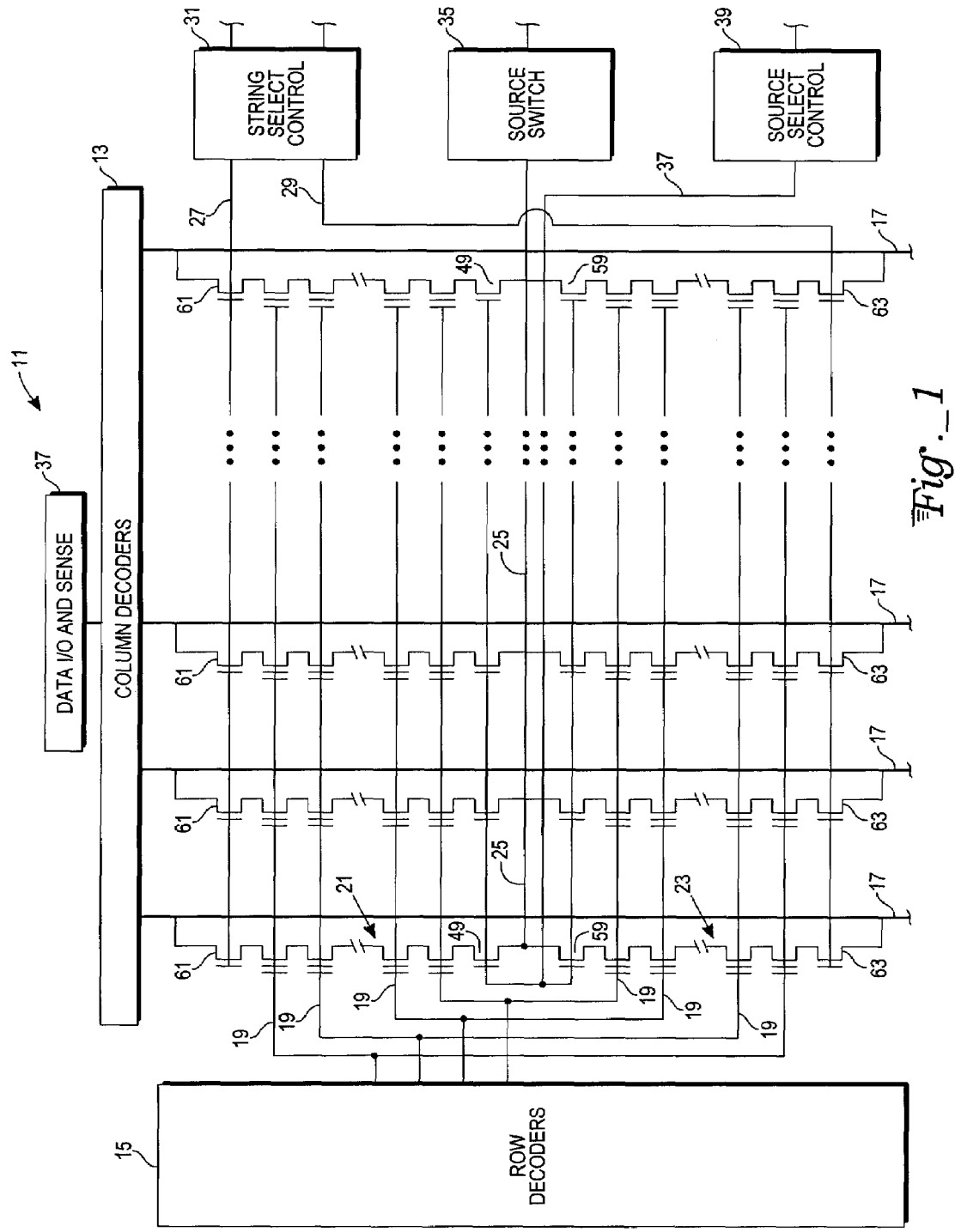
FIG. 1 is an electrical schematic plan view of a first embodiment of a memory array in accordance with an embodiment of the invention.

With reference to FIG. 1, a portion of a non-volatile NAND memory array 11 has column decoders 13 and row decoders 15. The array portion 11 is a left portion of a symmetric memory array having a mirror image right portion described below with reference to FIG. 8. The mirror image portion may share the same column and row decoders. The memory array portion 11 has bit lines 17 associated with the column decoders and with select transistors 61 and 63 for each string of the non-volatile array. Since the memory array 11 is a NAND array, the source of one memory cell is connected to the drain of an adjacent cell in a cascaded string arrangement where each string has a number of transistors representing one byte. In the exemplary embodiment of FIG. 1, two strings connected together hold two strings of data. More than two strings could be cascaded. A first string 21 in the non-volatile array is in cascade relationship with the second string 23 with the source line 25 running between the strings. Strings are independent of each other because they are controlled by a first string select line 27 and a second string select line 29, each select line operating a string select transistor 61 and 63, respectively, in relation to a connected bit line 17. Bit line 17 will feed data to a string, if it is selected by a corresponding select line. The select lines are controlled by a string select control 31 which is a means for selecting among the strings associated with each bit line. Data sensing and feeding (I/O) is performed through the bit lines 17 and the column decoders 13. Source line 25 is connected to ground or zero volts during a read operation, to a floating mode during an erase operation and to $V_{DD}$ during a program operation. Access to the strings is from the bit lines using select transistors 61 and 63 associated with select lines 27 and 29 for control. On each side of source line 25 there is a source select transistor 49 and 59 which serves to activate a string when selected by the source select control 39 using a source select line 37. Both source select transistors of two connected strings have control gates that are connected together and work cooperatively. A plurality of word lines 19, associated with row decoder 15 span the array in the row direction, perpendicular to the column direction, contacting the control electrode of each memory transistor in a row.

Figure 2:
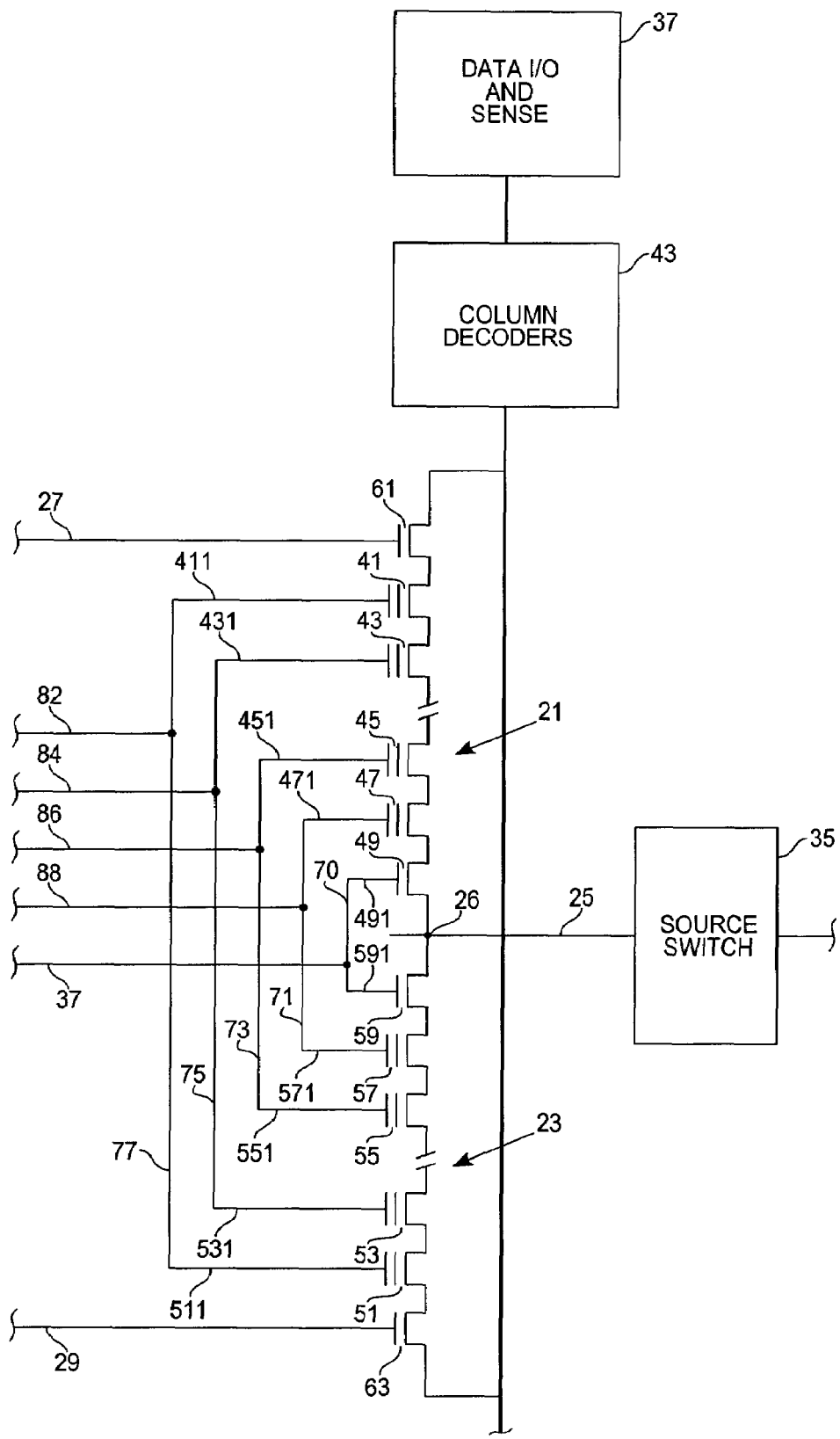
FIG. 2 is a simplified schematic detail of the plan view of FIG. 1 in accordance with an embodiment of the invention.

With reference to FIG. 2, first string 21 of memory transistors in the NAND array has word line memory transistors 41, 43, 45, and 47. The second string 23 has word line transistors 51, 53, 55, and 57. Each string has more transistors, not shown for purposes of simplification. Each string has an independent select transistor. Select transistor 61 is associated with select line 27. Select transistor 63 is associated with select line 29. The source select transistor 49 and the source select transistor 59 are connected to source select line 37. Corresponding memory cells in each of the first and second strings have joined word lines. Memory transistors 41 and 51 are joined by word line extensions 411 and 511 joined by the joinder segment 77. Memory transistors 43 and 53 in each corresponding string 21 and 23 have word line extensions 431 and 531 joined together by joinder segment 75. Memory transistors 45 and 55 in the respective strings 21 and 23 are joined by the word line extensions 451 and 551 connected by the joinder segment 73. Memory transistors 47 and 57 have word line extensions 471 and 571 joined by the joinder segment 71. The source select transistors 49 and 59 have word line extensions 491 and 591 associated with each of the strings 21 and 23 respectively, joined by the joinder segment 70. It is seen that the word lines in each string are joined by joinder segments in a U-shaped or open loop arrangement, but a U-shape is incidental and not necessary. A single word line output can make contact with the outside world. For example, word line output 82 is connected to joinder segment 77. Word line output 84 is connected to joinder segment 75. Word line output 86 is connected to joinder segment 73, and word line output 88 is connected to joinder segment 71. The source select output line 37 is connected to the select transistor joinder segment 70.

Figure 3:
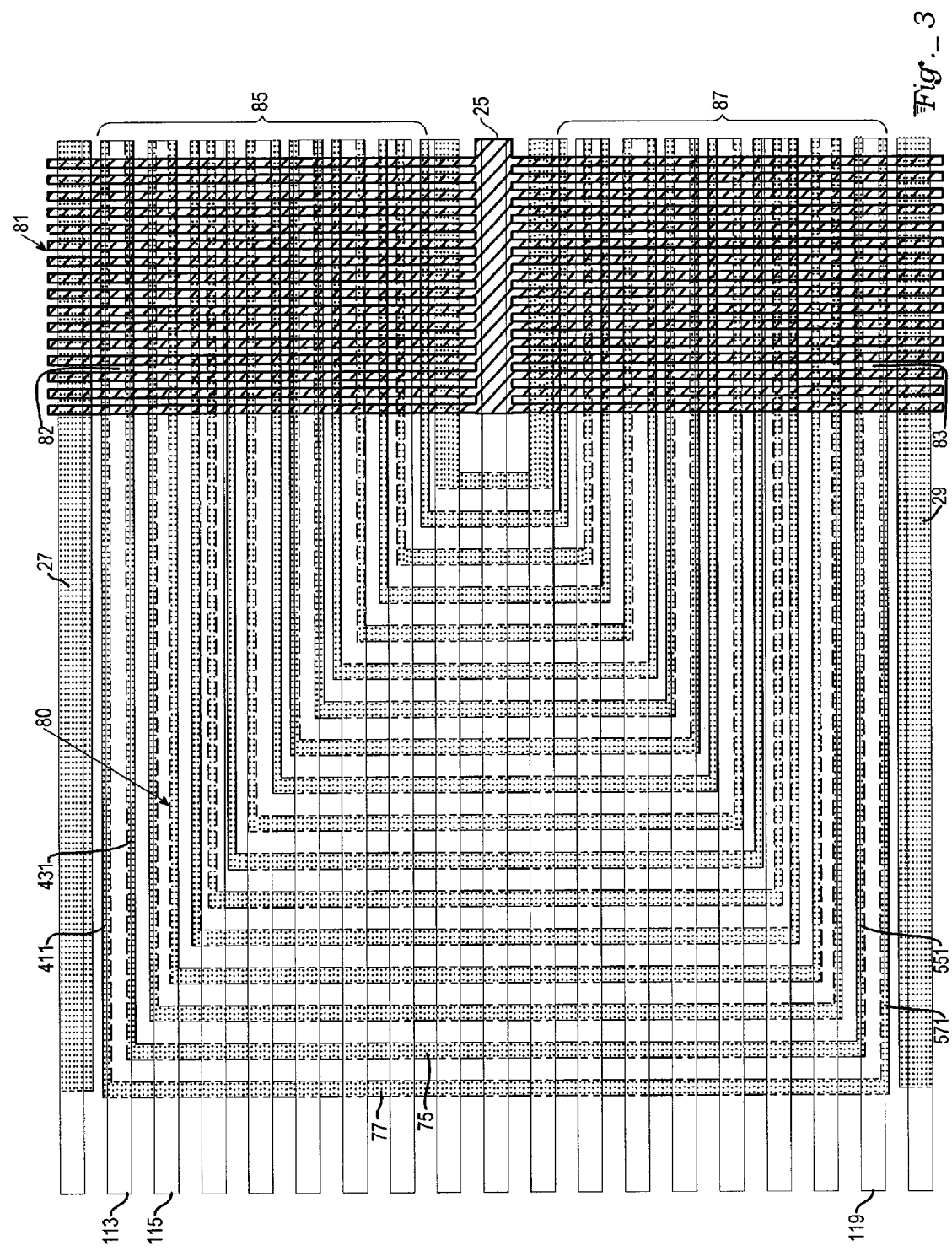
FIG. 3 is a top view of a circuit layout for a portion of the memory array of FIG. 1, with metal straps of top metal layer shown in accordance with an embodiment of the invention.

With reference to FIG. 3, word line extensions 80 are seen emerging from the first non-volatile memory cell block 81 with the upper half of the block 82 symmetric with respect to the lower half 83 about source line 25. Polysilicon is indicated by dotted shading. The first non-volatile memory block 81 has an associated group of word lines 85, while the second non-volatile memory block 83 has the second word line group 87.

In a first embodiment of the new NAND non-volatile transistor memory array of the present invention, each pair of adjacent word line extensions such as 411 and 431 has a single overlying metal strap 113. The word line extensions 411 and 431 are extended to the left in the drawing and joined to corresponding word line extensions 571 and 551 by means of word line joinder segments 77 and 75. The connected word lines have the appearance of a set of nested word line loops.

It should be noted that the connector segments are significantly wider than the word lines. The word lines are patterned in polysilicon, in an embodiment, to the minimum feature size allowed by lithography, corresponding to a similar memory size dimension. This allows word lines to exit a non-volatile memory block, such as block 81 with a pitch between word lines and word line extensions that is the same as the pitch between memory cells. For example, for a word line width of the minimum feature size, F, the pitch between adjacent word lines is related to the width of a memory cell. However, the word line joinder segments joining two word line extensions have no similar size constraint and can have a larger dimension, such as 3F or 4F. Thus, the joinder segments 75 and 77 are significantly wider than the word line extensions that they join, namely word line extensions 411 and 571, corresponding to joinder segment 77 and word line extensions 431 and 551 corresponding to joinder segment 75. Metal strap 119 overlies portions of the polysilicon word line extensions 551 and 571. Metal strap 115 overlies portions of the two adjacent polysilicon word lines adjacent to word line extensions 411 and 431.

Figure 4:
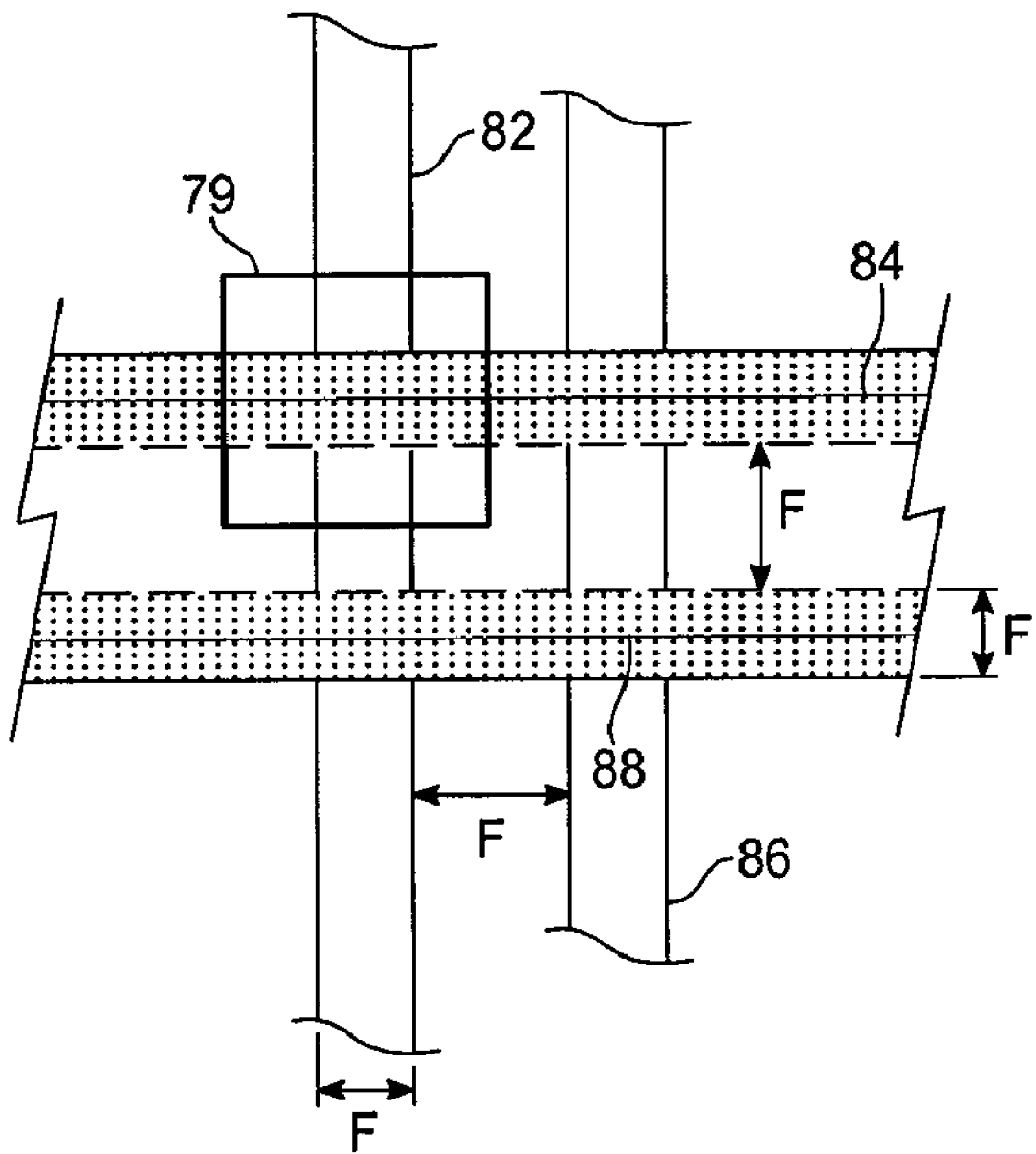
FIG. 4 is a top plan view of a memory cell of FIG. 3 with an associated bit line and word line in accordance with an embodiment of the invention.

With reference to FIG. 4, a representative single memory cell 79, indicated by the heavy black rectangle, is associated with a subsurface bit line 82 and a polysilicon word line 84. The word line 84 passes over the top of the memory cell 79. The memory cell 79 has a width dimension of 2F, the same dimension as the word line pitch 84 and a length dimension of 2F. Total area is $4^2$. A neighboring bit line 86 and neighboring polysilicon word line 88 are also seen. The spacing between bit lines and word lines, center to center, is seen to be 2F, or edge-to-edge to be F.

Figure 5:
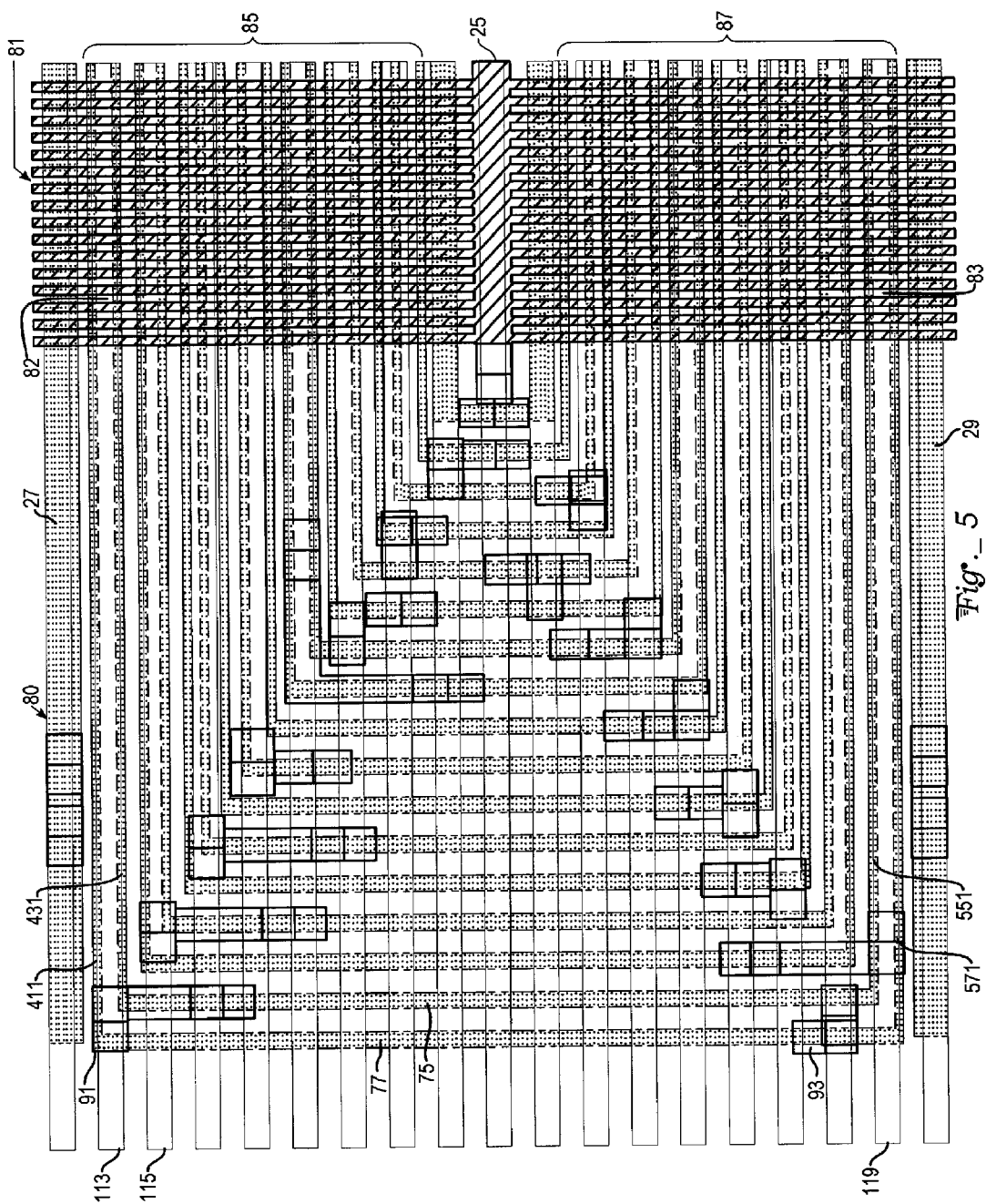
FIG. 5 is a top view of the circuit layout of FIG. 3 with metal straps of top metal layer and metal connector segments shown in two layers of metal in accordance with an embodiment of the invention.

Word line straps make contact with the polysilicon word lines by means of intervening metal connector segments which connect word lines with an associated strap at a joinder segment. In FIG. 5, connector segment 91 is seen to be straddling word line extensions 411 and 431 while making contact with both the word line extensions, as well as the joinder segment 75. Similarly, the joinder segment 93 straddles the word line extensions 551 and 571, or nearby joinder segments and makes contact with joinder segment 77. Other metal connector segments are seen for connecting each word line to an associated strap at a joinder segment.

Figure 6:
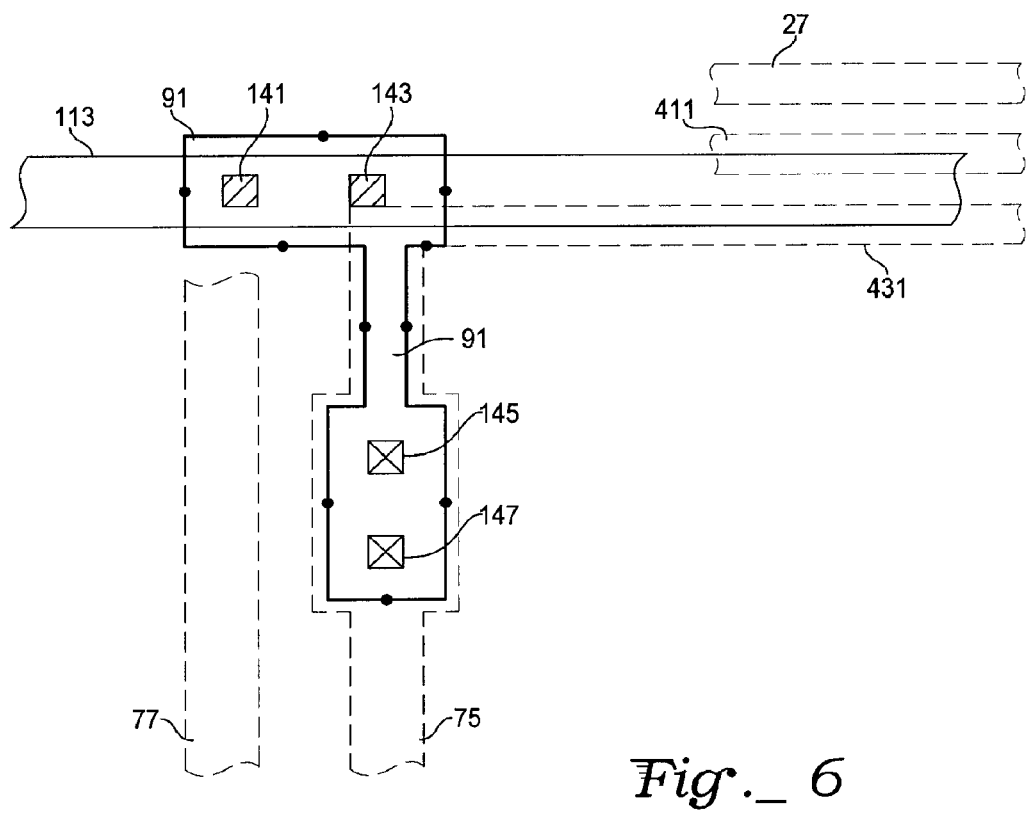
FIG. 6 is a metallization detail of a portion of the top view of FIG. 5 in accordance with an embodiment of the invention.

With reference to FIG. 6, metal strap 113 is seen to overlie and partially straddle polysilicon word lines 411 and 431 adjacent to the first string select line 27. Metal strap 113 is associated with metal connector segment 91, a portion of a first metal layer known as metal 1. The connector segment 91 is below the metal strap 113 which is part of a second metal layer known as metal 2.

Figure 7:
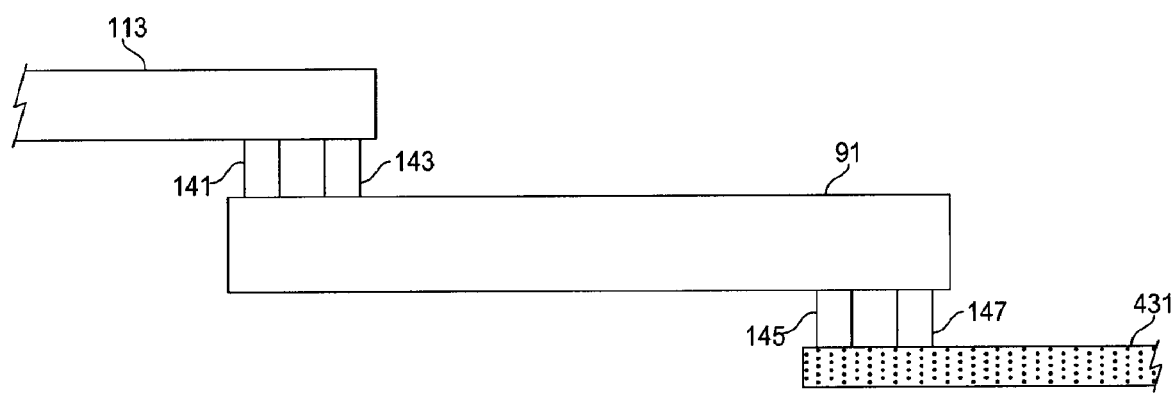
FIG. 7 is a side plan view of the metallization detail shown in FIG. 5 in accordance with an embodiment of the invention.

Via pathways 141 and 143 are established by lithography to connect the metal strap 113 to the connector segment 91. In turn, the connector segment 91 is connected to polysilicon word line joinder segment 75 by means of contacts 145 and 147 which are established in the wider portion of word line joinder segment 75, adjacent to word line joinder segment 77. The connections may be visualized by the vertical profile of FIG. 7. The metal 2 strap 113 over the word lines, including polysilicon word line 431, has the intervening connector segment 91 formed in a metal 1 layer. Conductive vias 141 and 143 electrically connect metal strap 113 to the conductive metal connector segment 91. In turn, contacts 145 and 147 connect the connector segment 91 to the polysilicon word line 431. Using such connector segments, some of which are L-shaped, all word lines may be connected to a metal strap for reducing electrical resistance, as well as some capacitance, along word lines. By reducing the resistive delay associated with the word lines, higher performance can be obtained from a memory array.

Figure 8:
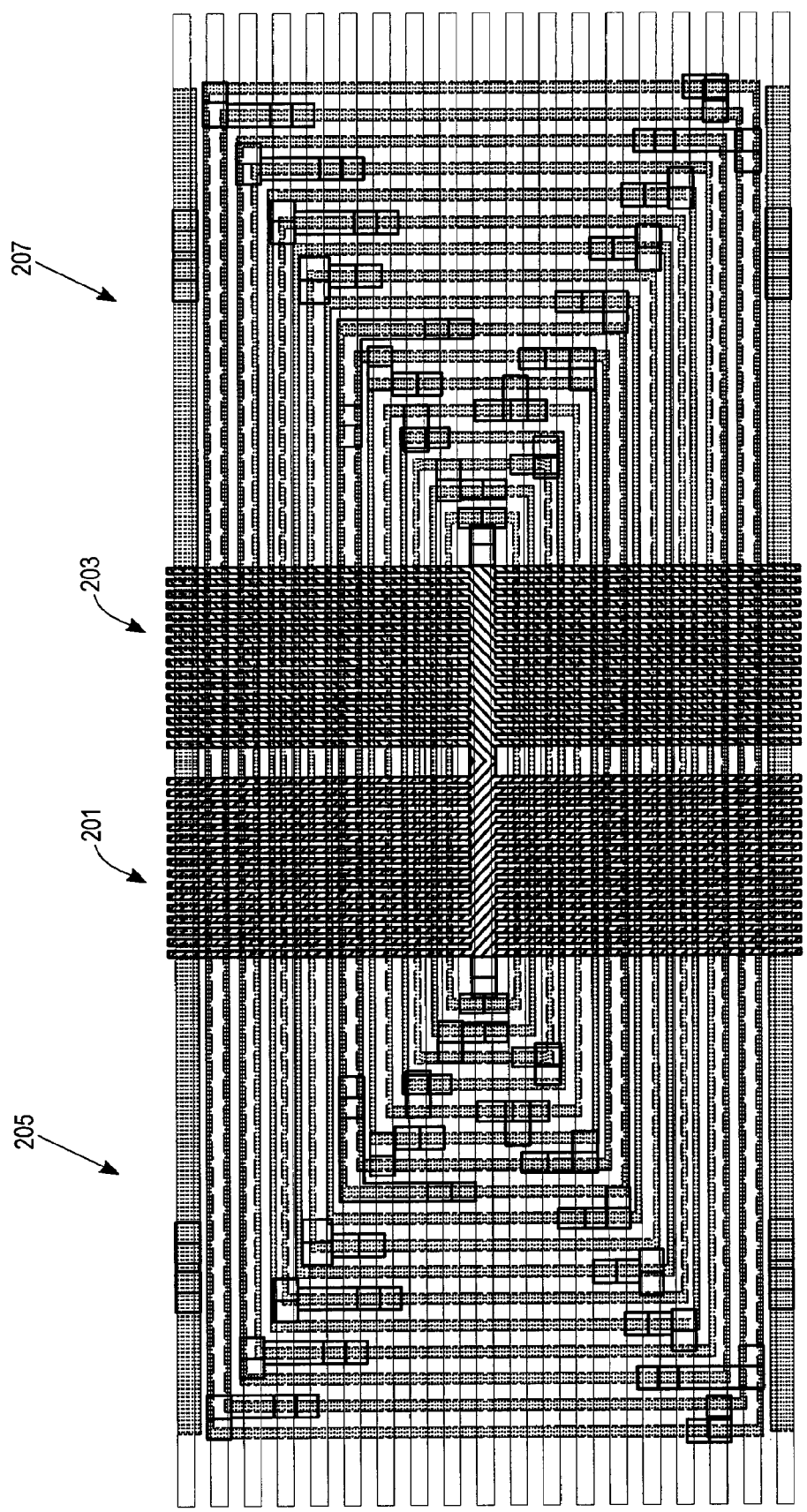
FIG. 8 is a top view of symmetric halves of a memory array of the type shown in FIG. 3 in accordance with an embodiment of the invention.

In FIG. 8, symmetric block halves of a memory array are seen. A left memory block 201 is adjacent to a right memory block 203. The looped word line extensions 205 are symmetrically opposite word line extensions 207. Operation of the two halves is as described with reference to FIG. 5. The word line loops have a U-shape in poly but this is merely a convenience of lithography. Loop shapes may be completed in metal and in this situation, poly J-shape loop portions may face each other and be connected together by metal. While FIG. 8 shows only two block halves, a much larger number of blocks can be driven with the same word lines. Similarly, more than two strings can be cascaded with appropriate string select transistors.

To operate cascaded string memories of the type described herein, it is desirable to deal with the problem of word line disturb voltages on shared word lines. This is not the same disturb voltage problem as arises from voltage leakage to adjacent cells through source-drain connections. Here, the selection of joined word lines causes electrically joined transistor electrodes to rise and fall together. Even though a string may be isolated with a pair of select transistors at opposite ends of the string, it is possible that word line disturb voltages can affect a non-selected transistor. The situation is illustrated in FIG. 9.

With reference to FIG. 9, a drawing showing only two columns of FIG. 1, assume that word line memory transistor 221 is selected. Column line 213 will also have an appropriate voltage for a desired operation. The adjacent column line 215 will not have the appropriate voltage for the desired operation but word line memory transistor 222 shares the same selected word line, WL<Sel>. Because of the joinder connections previously described, word line memory transistors 223 and 224 also share the same selected word line WL<Sel>. All other word line memory transistors are on unselected word lines <UnSel>, and are exemplified by unselected word line transistors 225 and 226 in the upper string and unselected word line transistors 227 and 228 in the lower string. Select transistors 217 and 231, as well as corresponding transistors 218 and 232, all associated with upper strings, can be used to address and isolate the upper strings using the SEL_H signal for transistors 217 and 218 and the upper GSEL for transistors 231 and 232. Similarly select transistors 219 and 233, as well as corresponding transistors 220 and 234, all associated with lower strings, can be used to address and isolate lower strings using the SEL_L signal for transistor 219 and 220 and the lower GSEL for transistors 233 and 234. The upper and lower GSEL signals are always the same because corresponding lines are joined.

However, for a selected word line memory transistor 221, it is important to prevent disturb voltages on word line memory transistors 222, 223, and 224 that all share the same activated word line. In some situations, disturb voltages occur in programming when high voltage is applied over word lines to control gates to stimulate charged particle motion to or from floating gates. Thus, if word line memory transistor 221 is selected for programming, then word line memory transistors 222, 223, and 224 are inhibited. The inhibited cells are selected word line transistors on the same column line but shut off by select transistors associated with a non-selected string, as well as selected word line transistors on an adjacent column line where the column voltage is inappropriate for the desired programming operation.

One embodiment conducts program operations in two clocked phases. In FIG. 10, the transistors and bit lines 213 and 215 of FIG. 9 are shown with various read, erase, and program voltages in block 240 with read voltages in column 242, erase voltages in column 244 and the two clocked program or write phases illustrated in columns 252 and 254 corresponding to a first phase φ1 and a second phase φ2, respectively. Referring to column 242 the lower string is unselected (0V), shutting off select transistor 219 and the upper string is selected (4.5V) for reading.

For an erase operation, both upper and lower strings are selected (18V) by means of a shared p-well. The word lines are shorted together. All memory cells sharing the same word lines in the upper and lower strings are erased at the same time.

For a program operation, refer to the two clock phases in columns 252 and 254. In a first phase of column 252, voltages are applied to inhibit selected word lines transistors 221, 222, 223, and 224. In a second phase of column 254, select transistors 219 and 220 are turned off by moving their gates to ground which in one embodiment is 0V. Bit line 213 is discharged to ground to set the program condition for transistor 221. The selected word line associated with transistor 221 is charged to the program voltage (say 18V in one embodiment) to program transistor 221. The unselected word lines are charged to 8V to induce the known channel boosting effect on transistors 222, 223, and 224. In this manner, read disturb voltages are minimized.

With reference to FIG. 11, word line extensions 80 are seen, as in FIG. 3, emerging from the first non-volatile memory cell block 81 with the upper half of the block symmetric with respect to the lower half about source line 25. Polysilicon is indicated by dotted shading. The first non-volatile memory array block 81 has an associated group of word lines 85, while the second non-volatile memory array block 83 has the second word line group 87. Each word line in word line group 85 is electrically joined to a corresponding word line in word line group 87 by a word line connector segment. The joined word lines form a plurality of nested loops as seen in FIG. 11 where the loops are U-shaped nested loops. Other shapes could be employed.

A row decoder block 112 contains one row decoder for each pair of joined word lines. For example word lines 122 and 124 are joined by connector 126. This pair of connected word lines is assigned to row decoder 128. Since only one string is selected at a time, the row decoder 128 communicates with a selected string through one of the word lines 122 or 124. In the same manner, row decoder 132 is electrically connected to word lines 134 and 136 and specifically to connector 138 which is joining the two word lines. A total of 16 row decoders are assigned to 16 pairs of joined word lines, with each row decoder specifying a word line in a selected string.

The assignment of a single row decoder to two word lines cuts down on the number of needed row decoders. Since select transistors will also have joined word lines, extra row decoders must be provided for each pair of row decoder word line pairs. The savings in number of row decoders is fifty percent for memory transistors with joined word lines and somewhat less for the array including joined word lines of connected select transistors. The memory architecture of embodiments of the invention permits this savings in row decoders.

Various embodiments of the invention described a new NAND memory architecture that allows for high speed word lines. Another advantage of this architecture is a reduced number of row decoders since word lines are joined together. A reduced number of row decoders could be used without the word line straps described herein, with each row associated with a transistor in each string with electrically joined word lines.

What is claimed is:

1. A non-volatile semiconductor memory array of the type having blocks of rows and columns of memory cells with word lines running parallel to the rows and bit lines running parallel to the columns comprising:
   first and second strings of non-volatile memory transistors associated with a bit line in a block in a NAND configuration, each string having a separate select line; and
   word line extensions associated with word lines from corresponding rows of the first and second strings electrically joined by joinder segments thereby forming a loop between strings whereby two word lines in different strings are electrically joined.

2. The memory array of claim 1 wherein joinder segments are wider than word line extensions.

3. The memory array of claim 2 wherein the word line extensions have a minimum feature size width, F.

4. The memory array of claim 3 wherein joinder segments have a width greater than F.

5. The memory array of claim 1 wherein the first and second strings are joined at a common source line.

6. The memory array of claim 1 further comprising:
   a plurality of metal straps over word lines and word line extensions, with one strap over portions of two word lines; and
   a plurality of metal connector segment means for connecting a word line to an associated strap at a joinder segment.

7. The memory array of claim 6 further comprising a plurality of row decoders, a row decoder associated with two word lines in different strings that are electrically joined.

8. The memory array of claim 1 being mirrored in a plurality of blocks.

9. A non-volatile memory array comprising:
   rows and columns of non-volatile memory transistors having a plurality of parallel word lines, one word line associated with each row, and a plurality of bit lines, both the word lines and the bit lines extending from the array, the array having strings of memory transistors in a column in a NAND arrangement and associated with a common bit line, with corresponding memory transistors in first and second strings having joined word lines; and
   means for selecting among the strings associated with the bit lines.

10. The memory array of claim 9 wherein word lines in the array have a first width portion and word lines extending from the array have a second width portion wider than the first width portion.

11. The apparatus of claim 10 further comprising:
    a plurality of metal straps parallel to the word lines in the array with metal straps above the word lines; and
    a plurality of metal connector segment means for connecting a word line to an associated strap, the connection being outside of the array at a location where a word line segment has said second width portion.

12. The memory array of claim 11 wherein adjacent word lines in the array share a metal strap.

13. The memory array of claim 11 wherein the plurality of metal straps are in a metal 2 layer and the plurality of metal connector segment means are in a metal one layer.

14. The memory array of claim 9 wherein the array comprises mirror image halves, with each half being an independent memory block.

15. The memory array of claim 9 further comprising a plurality of row decoders, a row decoder associated with two word lines in different strings that are electrically joined.

16. The memory array of claim 14 further comprising a plurality of row decoders, a row decoder associated with two word lines in different strings that are electrically joined.

17. The memory array of claim 9 wherein the word line segments in the array have a dimension equal to a minimum feature size F.

18. The memory array of claim 9 wherein the word line segments in the array have a spacing between word lines at least equal to a minimum feature size F.

19. The memory array of claim 9 wherein the word line regions outside of the array have a dimension of at least 2F where F is a minimum feature size.

20. The memory array of claim 9 wherein word line segments outside of the array are nested.

21. The memory array of claim 20 wherein the word line segments outside of the array have a nested U-shape in joining word lines from the two strings.

22. A method of making a non-volatile memory array of the type having rows and columns of memory transistors with word lines and bit lines corresponding to the rows and columns comprising:
    arranging the memory transistors in selectable strings in a NAND arrangement;
    extending word lines outside of the array to provide word line extensions; and
    connecting word lines of corresponding transistors of different strings using extensions of the word lines.

23. The method of claim 22 further defined by:
providing metal straps over the word lines and portions of the word line extensions;
joining the metal straps to the word lines.

24. The method of claim 22 further defined by:
connecting word lines of corresponding transistors by a plurality of nested word line loops.

25. The method of claim 22 further defined by making the characteristic dimension of the word lines and word line extensions equal to the minimum feature size.

* * * * *

UNITED STATES PATENT AND TRADEMARK OFFICE
CERTIFICATE OF CORRECTION

PATENT NO. : 7,684,245 B2  Page 1 of 1
APPLICATION NO. : 11/928086
DATED : March 23, 2010
INVENTOR(S) : Steve Schumann et al.

It is certified that error appears in the above-identified patent and that said Letters Patent is hereby corrected as shown below:

In column 4, line 61, delete "$4^2$." and insert -- $4F^2$. --, therefor.

Signed and Sealed this

First Day of June, 2010

David J. Kappos
*Director of the United States Patent and Trademark Office*